US 6,538,284 B1

(12) United States Patent
Riccobene et al.

(10) Patent No.: US 6,538,284 B1
(45) Date of Patent: Mar. 25, 2003

(54) SOI DEVICE WITH BODY RECOMBINATION REGION, AND METHOD

(75) Inventors: Concetta E. Riccobene, Mountain View, CA (US); Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 09/776,197

(22) Filed: Feb. 2, 2001

(51) Int. Cl.[7] .......................... H01L 27/01; H01L 27/12; H01L 31/0392; H01L 29/167
(52) U.S. Cl. .................. 257/347; 257/349; 257/607
(58) Field of Search ................. 257/607, 347, 257/349, 59, 362; 438/162

(56) References Cited

U.S. PATENT DOCUMENTS

| | | | |
|---|---|---|---|
| 5,578,865 A | 11/1996 | Vu et al. | |
| 5,821,559 A | 10/1998 | Yamazaki et al. | |
| 5,877,046 A | 3/1999 | Yu et al. | |
| 5,998,840 A | 12/1999 | Kim | |
| 6,005,285 A | 12/1999 | Gardner et al. | |
| 6,054,369 A | 4/2000 | Neilson et al. | |
| 6,210,998 B1 | 4/2001 | Son | |
| 6,211,041 B1 * | 4/2001 | Ogura | 257/347 |
| 6,288,425 B1 * | 9/2001 | Adan | 257/347 |
| 6,337,500 B1 | 1/2002 | Nakaoka et al. | |

FOREIGN PATENT DOCUMENTS

GB          2 233 822 A       1/1991

OTHER PUBLICATIONS

MOS Scaling: Transistor Challenges for the $21^{st}$ Century; Scott Thompson, Paul Packan and Mark Bohr, Intel Technology Journal (1998).

* cited by examiner

Primary Examiner—Amir Zarabian
Assistant Examiner—Kiesha Rose
(74) Attorney, Agent, or Firm—Renner, Otto, Boisselle & Sklar, LLP

(57) ABSTRACT

A transistor on an SOI wafer has a subsurface recombination area within its body. The recombination area includes one or more doped subsurface islands, the doped islands having the same conductivity type as that of a source and a drain on opposite sides of the body, and having an opposite conductivity type from the remainder of the body. The doped subsurface island(s) may be formed by a doping implant into a surface semiconductor layer, for example through an open portion of a doping mask, the opening portion created for example by removal of a dummy gate. The doping of the islands may be performed so that the doping level of the island(s) is approximately the same as that of the body, thus enabling both Shockley-Read-Hall (SRH) and Auger recombination to take place.

14 Claims, 3 Drawing Sheets

SOI DEVICE WITH BODY RECOMBINATION REGION, AND METHOD

CROSS REFERENCE TO RELATED APPLICATIONS

This application is related to commonly-assigned, copending U.S. application Ser. No. 09/484,634, filed Jan. 18, 2000, issued as U.S. Pat. No. 6,225,667. This application is also related to commonly-assigned U.S. application Ser. No. 09/712,320, titled "SOI Device With Self-Aligned Selective Damage Implant, and Method", filed Nov. 14, 2000, the entire disclosure of which is incorporated herein by reference.

BACKGROUND OF THE INVENTION

1. Technical Field

The present invention relates generally to semiconductor-on-insulator (SOI) devices and methods of making, and more specifically to SOI transistor devices having reduced floating body effects.

2. Description of the Related Art

Conventional or bulk semiconductor devices are formed in semiconductor material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, semiconductor-on-insulator technology (SOI) has been gaining popularity. A SOI wafer may be formed from a bulk silicon wafer by using conventional oxygen implantation techniques to create a buried oxide layer at a predetermined depth below the surface. The implanted oxygen oxidizes the silicon into insulating silicon dioxide in a gaussian distribution pattern centered at the predetermined depth to form the buried oxide layer. Field effect transistors formed on SOI substrates also may be able to achieve higher speed operation with higher drive currents, when compared with FETs formed on conventional bulk silicon substrates.

However, one problem with forming field effect transistors on an SOI wafer is the floating body effect. The floating body effect occurs because the buried oxide layer isolates the body of the transistor from the fixed potential silicon substrate and therefore the body takes on charge based on recent operation of the transistor. The floating body effect causes the current-to-voltage curve for the transistor to distort or kink, which in turn causes the threshold voltage for operating the transistor to fluctuate. This problem is particularly apparent for passgate devices such as those used in dynamic random access memory (DRAM) wherein it is critical that the threshold voltage remain fixed such that the transistor remains in the "off" position to prevent charge leakage from the storage capacitor.

Accordingly, there is a strong need in the art for a semiconductor circuit structure, and a method for forming such structure, that includes the low junction capacitance and low "off" state leakage characteristics of the SOI FET based circuits but does not suffer the disadvantages of a floating body potential.

SUMMARY OF THE INVENTION

A transistor on an SOI wafer has a subsurface recombination area within its body. The recombination area includes one or more doped subsurface islands, the doped islands having the same conductivity type as that of a source and a drain on opposite sides of the body, and having an opposite conductivity type from the remainder of the body. The doped subsurface island(s) may be formed by a doping implant into a surface semiconductor layer, for example through an open portion of a doping mask, the opening portion created for example by removal of a dummy gate. The doping of the islands may be performed so that the doping level of the island(s) is approximately the same as that of the body, thus enabling both Shockley-Read-Hall (SRH) and Auger recombination to take place.

According to an aspect of the invention, a semiconductor-on-insulator (SOI) transistor device includes an insulating layer made of an insulating material; an active layer of semiconductor material atop the insulating layer, the active layer including a body between a source and a drain, wherein the source and the drain are of a same conductivity type, and wherein the body is of an opposite conductivity type; and a gate atop the body. The body includes an island which is of the same conductivity type as the source and the drain, wherein the island is not in contact with the source or the drain.

According to another aspect of the invention, a semiconductor-on-insulator (SOI) transistor device includes an insulating layer made of an insulating material; an active layer of semiconductor material atop the insulating layer, the active layer including a body between a source and a drain, wherein the source and the drain are of a same conductivity type, and wherein the body is of an opposite conductivity type; and a gate atop the body. The body includes subsurface means for recombination due to both Auger recombination and Shockley-Read-Hall (SRH) recombination.

According to yet another aspect of the invention, a method of producing a semiconductor-on-insulator (SOI) transistor device includes the steps of forming a subsurface doped island in a surface semiconductor layer, the island having an opposite conductivity from that of semiconductor material surrounding the island; and forming a gate atop the surface semiconductor layer such that the island is at least partially underneath the gate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A semiconductor device includes a transistor on an SOI substrate, the transistor having a body which one or more subsurface islands of an opposite conductivity type than the rest of the body. The subsurface islands act as recombination centers, for example facilitating both Shockley-Read-Hall (SRH) and Auger recombination. The presence of the subsurface islands thus reduces minority carrier times in the body and thereby reduces floating body effects in the transistor.

Figure 1:
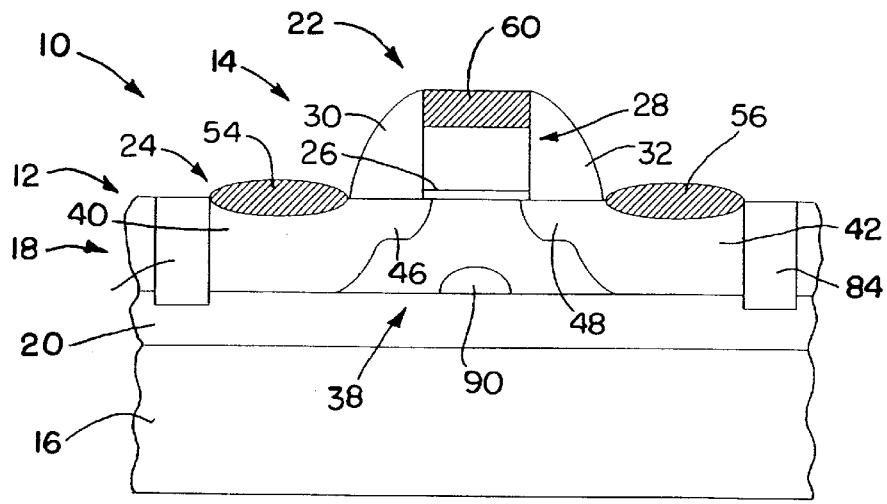
FIG. 1 is a cross-sectional view of a semiconductor device in accordance with the present invention.

Referring initially to FIG. 1, a semiconductor device 10 includes an SOI wafer 12 with a transistor 14 formed thereupon. The SOI wafer 12 includes a semiconductor substrate 16 and a surface semiconductor layer 18, with a buried insulator layer 20 therebetween. The semiconductor substrate 16 and the surface semiconductor layer 18 may be made of silicon, and the buried insulator layer 20 may be made of a silicon oxide such as $SiO_2$, although it will be appreciated that other suitable materials may be used instead or in addition.

The transistor 14 includes a gate 22 formed on an active semiconductor region 24 of the surface semiconductor layer 18. The gate 22 includes a gate dielectric 26 and a gate electrode 28. In addition, spacers 30 and 32 are on respective opposite sides of the gate 22. Exemplary materials for the gate dielectric 26 are $SiO_2$ and $Si_3N_4$. The gate electrode 28 may be made of polysilicon or another semiconductor, or may be made in whole or in part of metal. An exemplary material for the spacers 30 and 32 is SiN.

The active region 24 includes a body 38, with a source 40 and a drain 42 on respective opposite sides of the body. The source 40 and the drain 42 have respective source and drain extensions 46 and 48. As is conventional, the body 38 is primarily of different conductivity semiconductor material than the source 40 and the drain 42. For instance, the body 38 may be P-conductivity silicon while the source 40 and the drain 42 may be N-conductivity silicon. Alternatively, the body 38 may be N-conductivity silicon while the source 40 and the drain 42 may be P-conductivity silicon.

The body 38, the source 40, and the drain 42, are operatively coupled with the gate 22 to function as a transistor. The source 40 and the drain 42 have respective source and drain electrically-conducting metal-semiconductor compound regions 54 and 56 (also referred to as "silicide regions"), to facilitate electrical connection to the source and drain. The gate electrode 28 likewise may includes an upper conductive portion 60 to facilitate electrical connection.

The active region 24 is laterally isolated from other structures of the device 10 by insulator-filled trenches 82 and 84 on opposite sides of the active region. The insulator-filled trenches 82 and 84 may be trenches filled with silicon dioxide ($SiO_2$) using known shallow trench isolation (STI) techniques.

The body 38 includes a subsurface recombination island 90. The island 90 has a conductivity type opposite of that of the remainder of the body 38, and of the same conductivity type as that of the source 40 and the drain 42. The presence of the island 90 within the body 38 greatly increases the recombination rate within the body. This may occur due to the island 90 acting as a recombination center for the excess holes created in the body 38. The island 90 thus reduces minority carrier times within the body 38, thereby reducing the tendency of the body to build up charge, which in turn will change floating body potential.

The island 90 may have approximately the same level of doping as the body 38. For example, the island 90 may have a doping level of between approximately $5 \times 10^{17}$ and approximately $5 \times 10^{18}$ $cm^{-2}$, and the body may likewise have a doping level of between approximately $5 \times 10^{17}$ and approximately $5 \times 10^{18}$ $cm^{-2}$. Having the doping levels of the island 90 and the body 38 at approximately the same level may facilitate both Shockley-Read-Hall (SRH) recombination and Auger recombination.

The island 90 may be in contact with the insulator layer 20, as shown in FIG. 1. It will be appreciated that alternatively the island 90 may be fully within the body 38, not in contact with the source 40, the drain 42, or the insulator layer 20.

The island 90 may have a size of between approximately 10% and approximately 50% of a thickness of the body 38. The island 90 may be fully underneath the gate 22. Alternatively, it will be appreciated that the island 90 may be wholly or partially other than underneath the gate 22. The island 90 may be centered within the body 38 and/or relative to the gate 22. It will appreciated that alternatively the island 90 may be other than centered, for example being closer to the source 40 than to the drain 42.

It will be appreciated that multiple islands within the body 38 may be used, if desired.

Figure 2:
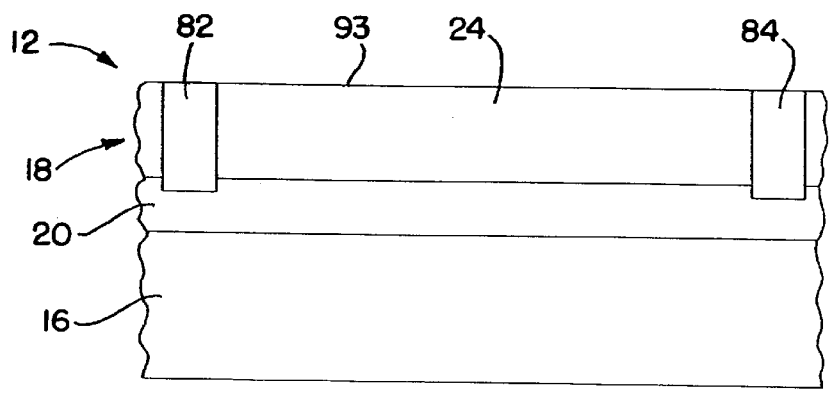
FIGS. 2–8 are cross-sectional views of various steps in a method of fabricating the semiconductor device of FIG. 1.

Various steps in the fabrication of the above-described semiconductor device 10 are illustrated in FIGS. 2–8. As illustrated in FIG. 2, initially insulator-filled trenches 82 and 84 are created in the SOI wafer 12. It will be appreciated that there are many well-known sources and methods for producing SOI wafers such as the SOI wafer 12. The insulator-filled trenches 82 and 84 define and laterally isolated the active region 24 of the surface semiconductor layer 18. The insulator-filled trenches may be formed using conventional well-known shallow trench isolation (STI) techniques. An exemplary process for forming an insulating trench 82 and 84 includes forming a thin layer of oxide, approximately 150–200 Angstroms thick, on a wafer surface 93 of the SOI wafer 12, forming a silicon nitride mask thereon. The mask covers and protects the substrate in the area where the active region 24 is to be formed while leaving exposed the area where the insulator-filled trenches 82 and 84 are to be formed.

Thereafter, the unmasked portions of the semiconductor surface layer 18 (e.g. the portions where the silicon nitride mask has been etched away) are etched away to form an open trench extending at least past the upper surface of the buried insulator layer 20. The etching process for a silicon substrate is typically an an isotropic dry etch using hydrogen bromide (HBr) which has selectivity characteristics such that it etches the silicon substrate but not the silicon nitride mask.

The open trench is filled by depositing silicon dioxide ($SiO_2$), formed by a chemical reaction involving $SiH_4$ or TEOS, to form insulating trenches 82 and 84. After filling the open trench the surface of the wafer is polished using a chemical mechanical polish to remove any excess silicon dioxide layer and the remaining silicon nitride mask.

Figure 3:
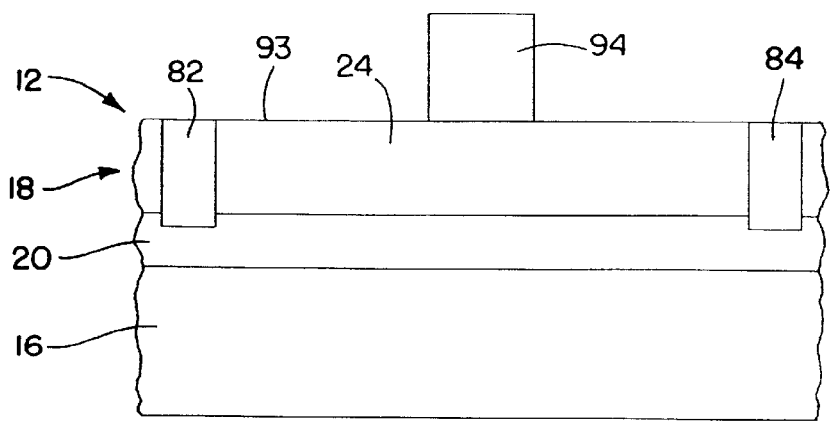

Turning to FIG. 3, a dummy gate 94 is then formed on the SOI wafer 12. The dummy gate 94 may be made out of a semiconductor material, such as polysilicon, and is formed on the wafer surface 93 of the surface semiconductor layer 18 of the SOI wafer 12. The dummy gate 94 may be formed by an of a variety of well-known processes such as low pressure chemical vapor deposition (LPCVD). It will be appreciated that the dummy gate 94 may be made out of a wide variety of suitable conductive, semiconductive, or non-conductive materials.

Figure 4:
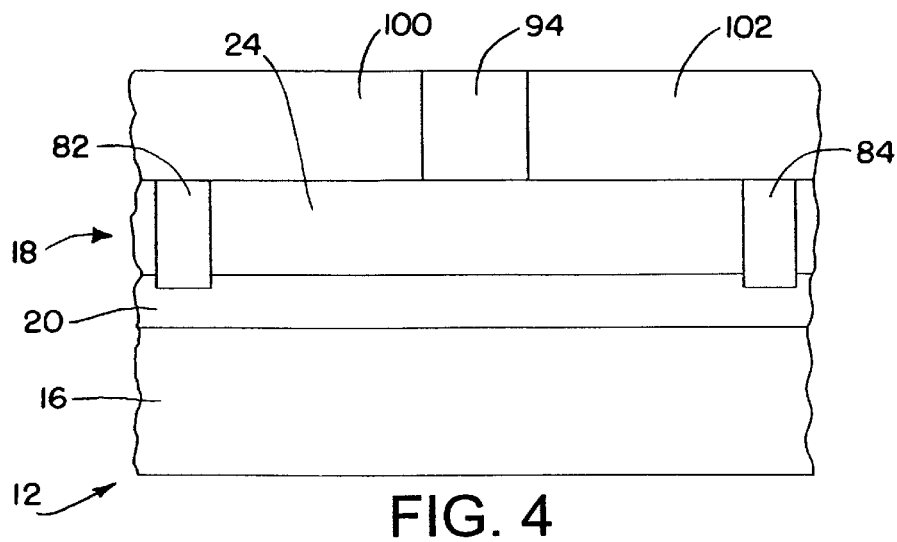

As illustrated in FIG. 4, mask elements 100 and 102 are then formed on opposite sides of the dummy gate 94. This may occur, for example, first by deposition of a layer of insulator material, for example silicon nitride, by a process such as CVD. Then well-known chemical-mechanical polishing (CMP) processes may be employed to expose the top of the dummy gate 94.

Figure 5:
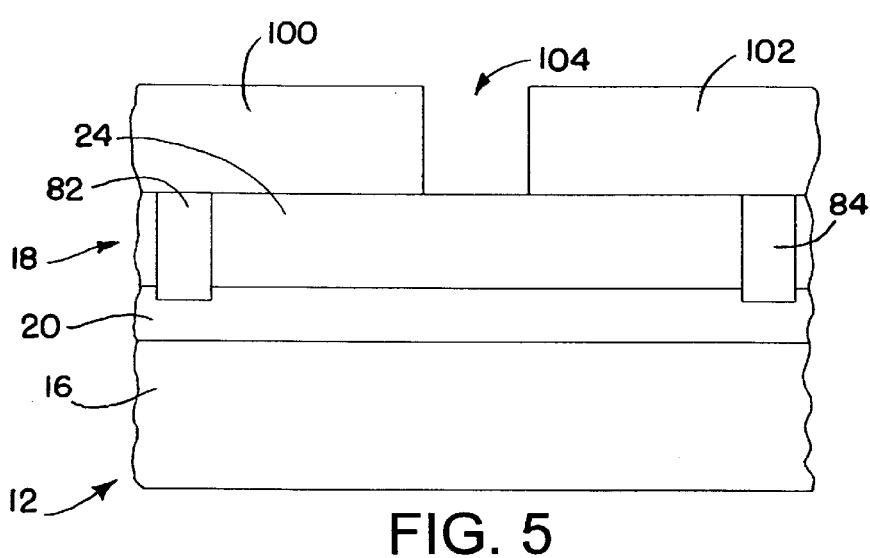

As shown in FIG. 5, the dummy gate 94 is then removed, for example by etching, to create an opening 104 for access to a portion of the underlying surface semiconductor layer 18. The etching used in removing the dummy gate 94 may include one or more dry etch processes such as plasma etching, ion milling, reactive ion beam etching, and/or may include other processes suitable for carrying out the invention.

Figure 6:
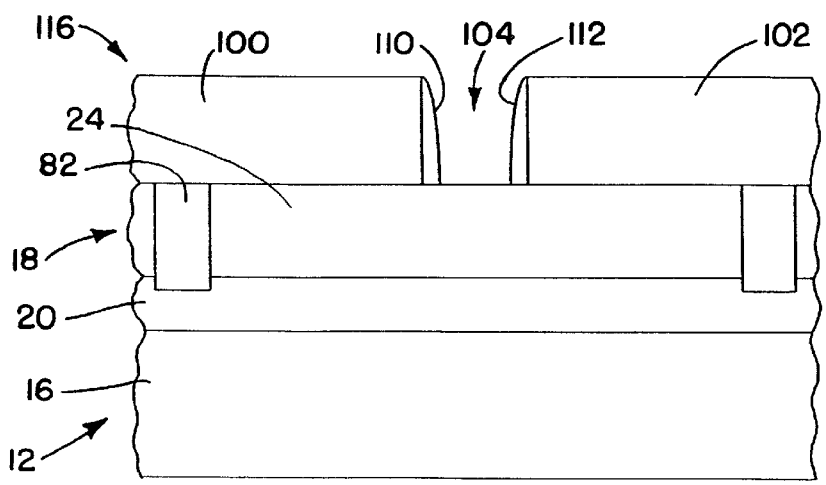
Figure 7:
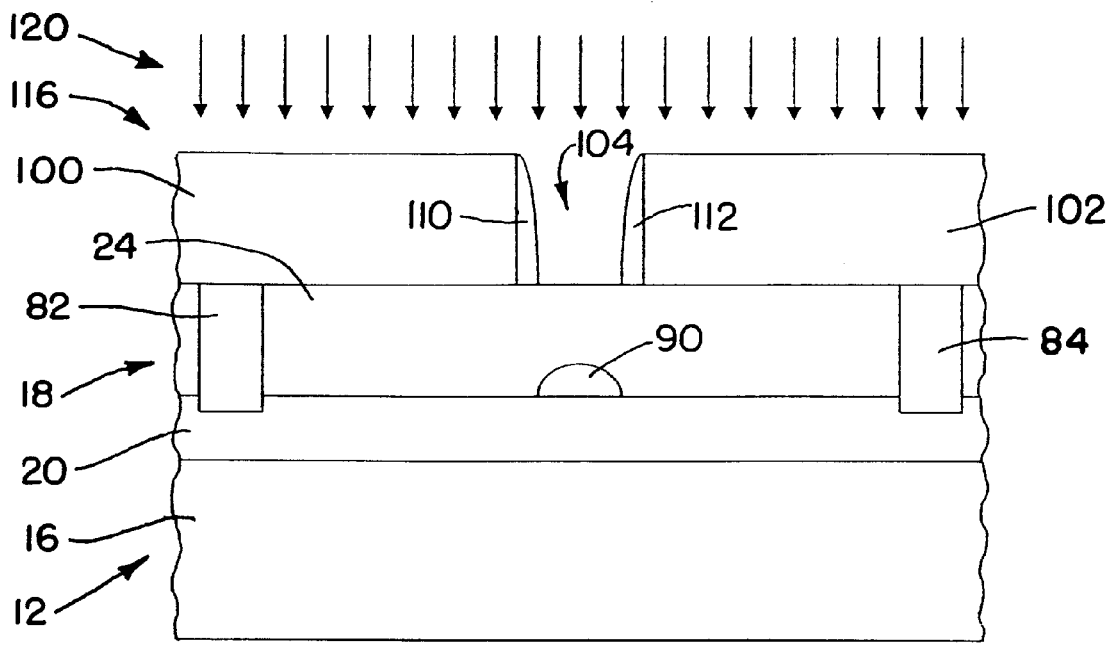

Then in FIG. 6, mask spacers 110 and 112 are formed to reduce the size of the opening 104, to thereby control the size and location of the subsequently-formed island. The mask spacers 110 and 112 may be formed by depositing a layer of a material, such as silicon oxide, and then etching the material to leave the spacers. The spacers 110 and 112 may be substantially identical, thus substantially symmetrically reducing the size of the opening 104. Alternatively, the spacers 110 and 112 may be different from one another, for example asymmetrically reducing the size of the opening 104.

A mask 116 is thus formed which includes the mask elements 100 and 102, and the mask spacers 110 and 112. The mask 116 is used as an implant mask for a doping implant 120, illustrated in FIG. 7, which is used for forming the subsurface doped island 90.

The doping implant 120 may be performed using conventional techniques. Doping is typically performed using well-known ion implantation techniques. Ions of an N-type dopant, such as arsenic, phosphorous, or antimony, may be accelerated to a high velocity in an electric field and impinge on the target wafer. The mask 116 absorbs the ions impinging on it, thus preventing doping except through the opening 104. The ions passing through the opening 104 penetrate the surface semiconductor layer 18 and form the subsurface doped island 90.

The doping implant 120 may be a perpendicular implant, or alternatively may include tilted implanting.

Figure 8:
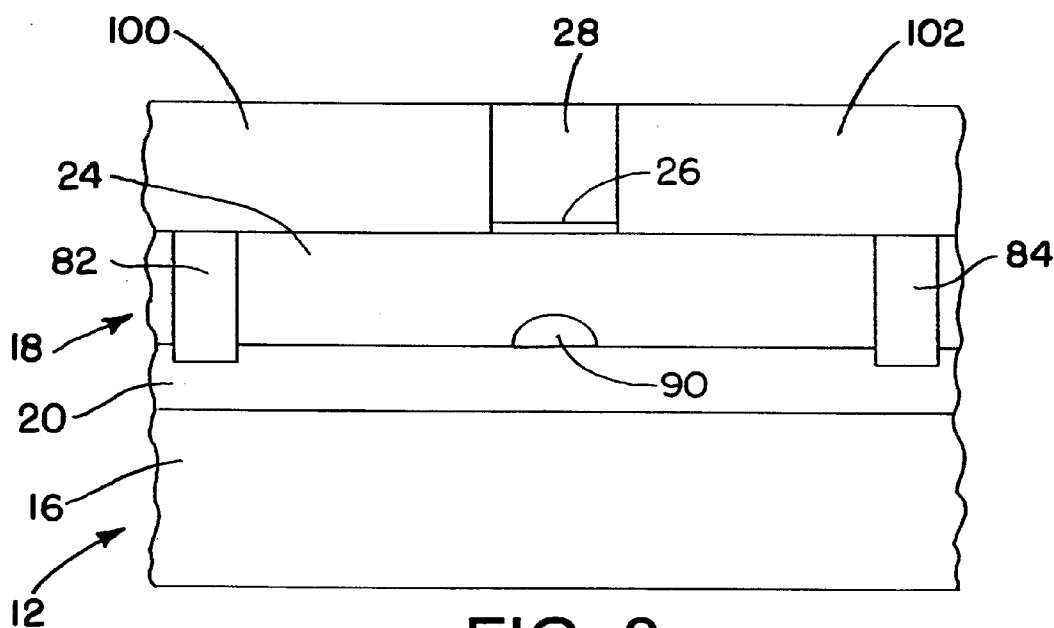

Thereafter, as illustrated in FIG. 8, the mask spacers 110 and 112 are removed and the gate 22 is formed. The gate dielectric layer 26 is formed by conventional means, such as deposition and thermal growth. Then the gate electrode 28 is formed. After formation of the gate 22, the mask elements 100 and 102 may be removed, for example by etching. Alternatively, the mask elements 100 and 102, and the mask spacers 110 and 112, may be removed first, prior to the formation of the gate dielectric layer 26 and the gate electrode 28.

The remaining structures of the transistor 14 may then be formed by well-known suitable means. Portions of the silicon on opposing sides of the active region 24 that are not masked by the gate 22 then may be doped to produce the source 40 and the drain 42. Such doping may be formed in a two-step doping process, with a low-energy doping to create the extensions 46 and 48, followed by formation of the spacers 30 and 32, and then a high-energy doping to create the remainder of the source 40 and the drain 42. Because the ions cannot penetrate the gate 22, the gate effectively operates as a doping mask, protecting the region of the semiconductor layer 18 underneath the gate from doping.

To form the spacers 30 and 32, a conformal dielectric layer (e.g., SiN) may be deposited on the SOI wafer 12 and on the gate 22. Parts of the dielectric layer are then selectively removed to leave respective gate source-side and drain-side spacers 30 and 32. The deposit of the dielectric material and its selective removal may be accomplished by conventional means, for example chemical vapor deposition (CVD) such as LPCVD or plasma enhanced chemical vapor deposition (PECVD), of silicon dioxide, followed by an isotropic etching using suitable, well-known etchants, an exemplary etchant being $CHF_3$.

Alternatively tilted implants may be used to form the source extension 46 and the drain extension 48.

The silicide regions 54 and 56 are then formed. Silicidation may then be accomplished as follows. A layer of metal is deposited upon the gate 22, the spacers 30 and 32, and the exposed portions of the surface semiconductor layer 18. The metal layer may be of a metal such as titanium, cobalt, or nickel, which is suitable for forming a conducting compound, such as a silicide, with the semiconductor material. The metal layer may be deposited, for example, by sputtering.

Then a compound such as a silicide is formed between the metal of the metal layer and the exposed portions of the surface semiconductor layer 18. Suitable methods for formation of such electrically-conducting compounds (e.g., silicidation) are well known, an exemplary method being raising temperature of the semiconductor device 10 to a suitable level for a suitable length of time (annealing). An exemplary temperature is between about 400 and 800° C., and an exemplary suitable length of time is between 10 seconds and 10 minutes. Rapid thermal annealing (RTA) may also be employed, for example subjecting the semiconductor device 10 to a temperature between 600 and 900° C. for about 5 to 120 seconds. It will be appreciated that other temperatures and heating times may be employed. Finally, excess metal of the metal layer is removed by conventional, well-known means.

The resulting structure is that shown in FIG. 1.

It will be appreciated that the above-described structure and method are only exemplary, and that many suitable variations may be employed. For example, the semiconductor material may be silicon or another suitable semiconductor material. It may be possible to substitute oxides for nitrides, and/or vice versa, in the above structure and/or in the above fabrication method.

The above-described method steps may be performed in a different order, with suitable modification. For example, some or all of the formation of the source 40, the drain 42, and the silicide regions 54 and 56 may be accomplished while the dummy gate 94 is in place, using the dummy gate as a mask. It will be appreciated that other suitable modifications of the above-described method are possible.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor-on-insulator (SOI) transistor device comprising:

an insulating layer made of an insulating material;

an active layer of semiconductor material atop the insulating layer, the active layer including a body between a source and a drain, wherein the source and the drain are of a same conductivity type, and wherein the body is predominantly of an opposite conductivity type; and a gate atop the body;

wherein the body includes an island which is of the same conductivity type as the source and the drain, and wherein the island is not in contact with the source or the drain;

wherein the island is a subsurface island below a top surface of the active layer; and wherein the island is fully enclosed within the body.

2. The device of claim 1, wherein the island has a dimension of between 10% and 50% of a thickness of the body.

3. The device of claim 1, wherein the island is fully underneath the gate.

4. The device of claim 1, wherein a doping level of the body is within an order of magnitude of a doping level of the island;

wherein the island, in combination with the body, facilitates Auger recombination; and wherein the island, in combination with the body, also facilitates Shockley-Read-Hall recombination.

5. A semiconductor-on-insulator (SOI) transistor device comprising:

an insulating layer made of an insulating material;

an active layer of semiconductor material atop the insulating layer, the active layer including a body between a source and a drain, wherein the source and the drain are of a same conductivity type, and wherein the body is predominantly of an opposite conductivity type; and a gate atop the body;

wherein the body includes subsurface means for recombination due to both Auger recombination and Shockley-Read-Hall (SRH) recombination.

6. The device of claim 5, wherein the means for recombination is fully enclosed within the body.

7. The device of claim 5, wherein the means for recombination includes a subsurface island which is of the same conductivity type as the source and the drain, and wherein the island is not in contact with the source or the drain.

8. The device of claim 7, wherein a doping level of the body is within an order of magnitude of a doping level of the island.

9. The device of claim 7, wherein the island is in contact with the insulating layer.

10. A semiconductor-on-insulator (SOI) transistor device comprising:

an insulating layer made of an insulating material;

an active layer of semiconductor material atop the insulating layer, the active layer including a body between a source and a drain, wherein the source and the drain are of a same conductivity type, and wherein the body is predominantly of an opposite conductivity type; and a gate atop the body;

wherein the body includes an island which is of the same conductivity type as the source and the drain, and wherein the island is not in contact with the source or the drain;

wherein a doping level of the body is within an order of magnitude of a doping level of the island;

wherein the island, in combination with the body, facilitates Auger recombination; and wherein the island, in combination with the body, also facilitates Shockley-Read-Hall recombination.

11. The device of claim 10, wherein the island is in contact with the insulating layer.

12. The device of claim 10, wherein the island has a dimension of between 10% and 50% of a thickness of the body.

13. The device of claim 10, wherein the island is fully underneath the gate.

14. The device of claim 13, wherein the island is fully enclosed within the body.

* * * * *